(12) United States Patent
Rouaissia et al.

(10) Patent No.: US 9,794,748 B2
(45) Date of Patent: Oct. 17, 2017

(54) CAPACITIVE PROXIMITY SENSOR AND MOBILE DEVICE

(71) Applicant: Semtech Corporation, Camarillo, CA (US)

(72) Inventors: Chaouki Rouaissia, Neuchatel (CH); Sebastien Grisot, Boudry (CH)

(73) Assignee: Semtech Corporation, Camarillo, CA (US)

( * ) Notice: Subject to any disclaimer, the term of this patent is extended or adjusted under 35 U.S.C. 154(b) by 22 days.

(21) Appl. No.: 14/824,294

(22) Filed: Aug. 12, 2015

(65) Prior Publication Data

US 2016/0057578 A1 Feb. 25, 2016

Related U.S. Application Data

(60) Provisional application No. 62/039,240, filed on Aug. 19, 2014.

(51) Int. Cl.
| *H04W 4/02* | (2009.01) |
| *H04W 4/00* | (2009.01) |
| *H04W 52/02* | (2009.01) |
| *H03K 17/955* | (2006.01) |
| *H04M 1/02* | (2006.01) |

(Continued)

(52) U.S. Cl.
CPC ............ *H04W 4/023* (2013.01); *G01B 7/14* (2013.01); *G06F 1/32* (2013.01); *G06F 3/011* (2013.01); *G06F 3/044* (2013.01); *H03K 17/955* (2013.01); *H04M 1/026* (2013.01); *H03K 2017/9613* (2013.01); *H03K 2217/960765* (2013.01); *H04M 2250/12* (2013.01); *Y02B 60/50* (2013.01)

(58) Field of Classification Search
CPC .. G06F 2203/0412; G06F 1/32; G06F 3/0418; G06F 3/044; G06F 3/0416; G06F 3/011; G06F 2203/04103; H04W 4/023; H03K 17/962
USPC ............... 455/550.1; 345/156.177, 419, 173; 341/33
See application file for complete search history.

(56) References Cited

U.S. PATENT DOCUMENTS

| 2005/0001633 | A1* | 1/2005 | Okushima | ............ | H03K 17/962 |
| | | | | | 324/658 |
| 2006/0250142 | A1* | 11/2006 | Abe | ..................... | H03K 17/955 |
| | | | | | 324/663 |

(Continued)

FOREIGN PATENT DOCUMENTS

| EP | 2876407 A1 | | 5/2015 | |
| SE | WO2013079267 | * | 6/2013 | ............. G06F 3/044 |
| WO | WO-2013/079267 A1 | | 6/2013 | |

OTHER PUBLICATIONS

European Search Report for EP 15180782.3, dated Dec. 18, 2015, 8 pages.

*Primary Examiner* — Inder Mehra
(74) *Attorney, Agent, or Firm* — Blank Rome LLP

(57) ABSTRACT

A proximity sensor for detecting proximity of a body portion in a first region while avoiding unwanted detection of a body portion in a second region, based on the capacities seen by a plurality of electrodes. An application of the inventive detector to a mobile phone, whereby the display is switched off, or various energy saving measure are taken, when the proximity sensor determines directional proximity with a body part, indicating that the user has brought the phone to the ear for placing a call.

13 Claims, 4 Drawing Sheets

(51) Int. Cl.
*G01B 7/14* (2006.01)
*G06F 1/32* (2006.01)
*G06F 3/01* (2006.01)
*G06F 3/044* (2006.01)
H03K 17/96 (2006.01)

(56) References Cited

U.S. PATENT DOCUMENTS

2010/0026656 A1* 2/2010 Hotelling ............... G06F 3/044
 345/174
2012/0280698 A1* 11/2012 Oya .................... G06F 3/03547
 324/658

* cited by examiner

CAPACITIVE PROXIMITY SENSOR AND MOBILE DEVICE

REFERENCE DATA

The present application claims priority from U.S. provisional application 62/039,240 of Aug. 19, 2014, the contents whereof are hereby incorporated by reference.

FIELD OF THE INVENTION

The present invention concerns a proximity sensor and a method for detecting the proximity of a body portion. Embodiments of the present invention concern in particular portable devices like cell phones that, being equipped with the inventive sensor are capable of detecting the proximity of body parts and discriminate the direction whence the detected body part is approaching.

DESCRIPTION OF RELATED ART

It is often desired to detect whether a body portion is at short distance of an apparatus. In the particular case of cell phones and wirelessly connected mobile device, (including tablets and other similar terminals), this could be used to shut down the background lighting when the proximity of the user's head is detected, thus reducing the power consumption during calls.

Avoiding false detection is, however, often important as well. In particular when the same or a different body portion approaches the apparatus from a different direction than the relevant one. In a cell phone, false detections may be due to the proximity of the fingers to the phone surface when handling it which, if detected as the presence of the head, will shut down the screen while the user is simply interacting with the phone.

Sensors arranged for detecting a body near to an object, including inductive, optical, heat, and capacitive based sensors, are known. In the cell phone market, the most common method today is the infrared optical detection that has a good range and directivity. The main drawbacks of the optical system are its power consumption, the cost of its components and of its integration in the phone and the size needed to implement the solution on the phone surface.

Capacitive sensors have a lower power consumption, require only a small area or no area on the phone surface and have a lower cost. They are however quite omnidirectional and therefore tends to generate lots of false positives, i.e. detection of body portions from irrelevant directions. This risk of false detection could be reduced by reducing severely the range of detection.

An example of capacitive sensor for proximity sensing in a mobile communication device is described in WO2013/079267, whose content is hereby included by reference. This solution requires a device having a capacitive touch-sensitive area for touch input, which is not always available. Even when such a touch display is available, the signals that it generates may not be easily to access and/or process.

Another capacitive sensor is described in US2010026656A, which also requires a touch panel.

European patent application EP2876407, in the name of the applicant describes capacitive sensors that are read by means of charge amplifiers connected to a floating variable voltage reference. The same document describes the use of such sensors in touch-sensitive displays.

BRIEF SUMMARY OF THE INVENTION

It is therefore an aim of the invention to provide a method and sensor based on a capacitive sensor and which has an improved direction discrimination, in order to reduce the risk of false detection.

Further, the present invention proposes a capacitive proximity device with an improved detection range.

Another aim of the invention is providing a method and sensor which could be adapted to mobile devices having a touch panel, but also to those that lack such a panel, and a corresponding mobile device.

It is another aim to provide a method and a sensor whose power consumption is far below that of infrared based systems.

According to an aspect of the invention, these aims are achieved by the objects of the appended claims.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
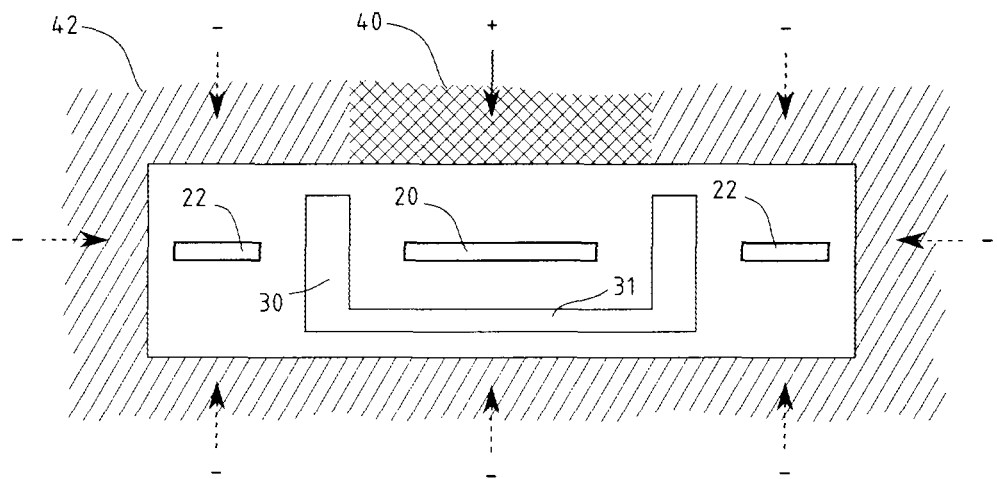
FIG. 1 illustrates a cut view of an example of a sensor according to the invention.

An example of sensor is illustrated on FIG. 1. It comprises one or a plurality of internal capacitive electrodes 20, 22 arranged for detecting electrical charges, indicative of proximity with an object, like for example a portion of the user's body, in a first region 40, for example the region where presence of a body portion should trigger an action, such as shutting down a display or the illumination of a display. A conductive shield 30 with lateral ground walls is arranged next to the central internal electrode 20, for example surrounding the internal electrode 20, in order to reduce the sensibility of the internal capacitive electrode to proximity of objects in at least one second region 42, which might for example include all the available space except the first region 40. The shield may have an annular shape and, preferably, might further include a bottom ground plate 31 below the internal electrode for preventing detection from the back.

At least one second external capacitive electrode 22 is provided on the other side of the shield for detecting electrical charges, indicative of proximity with an object in one or a plurality of second regions different from the first region. In the presented example, the external electrode 22 comprises an annular plate around the conductive shield 31 which is also annular, such that the external electrode 22 surrounds the shield 30 which in turn surrounds the central electrode 20. This is not however the only possible disposition. This external electrode has a low sensibility to charges from the first direction which are shielded by the ground wall, thus it is relatively insensitive to charges in the detection region 40, while it is highly responsive to charges in the rejection region 42.

An electronic circuit (not shown) receives signals from the internal electrode and signals from the external electrode, and makes a weighted comparison to determine whether a detected charge comes mainly from the first region, mainly from the second region, or from both regions.

The electronic circuit acquires signals from each individual directional electrode and apply a computation weighting the various electrodes to define the actual proximity in the desired region. A typical computation may be Position=CS2position−K*CS1position where K is set to reject signals coming from the region observed by CS1.

To get more directional control several "negative" electrodes can be used and individually weighted in the computation. A plurality of grounded shields may also be used.

The different electrodes are thus able to detect the proximity of a body portion from the top, from each side and from the bottom. With a specific algorithm, the electronics will be able to distinguish "positive" detection from "negative" detection (from other regions) and to generate a signal in order for example to shut down a display, or reduce its illumination, when a body portion is detected in the first region, or in the first region only.

Figure 2:
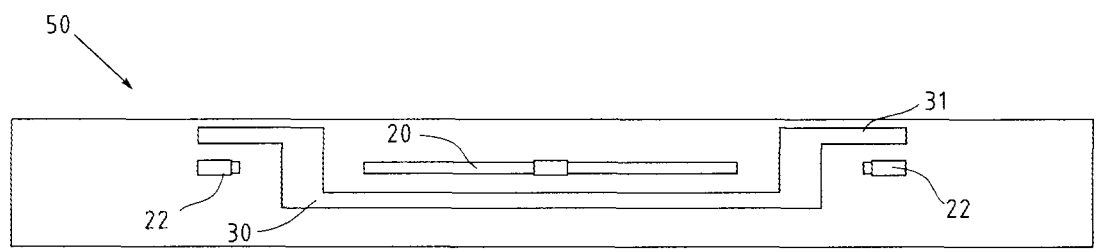
FIG. 2 illustrates a cut view of an example of a wireless phone including a proximity sensor according to the invention.

FIG. 2 illustrates an example of cell phone 50 including such a proximity sensor. In this embodiment, the external electrode 22 is mounted below an annular portion 33 of the ground shield 30, in order to reduce it sensitivity to charges in regions toward the front face of the phone as compared to charges from the back side. The internal electrode thus looks towards the screen surface side of the phone, while at least one external electrode looks toward the side and the bottom of the phone.

Figure 3:
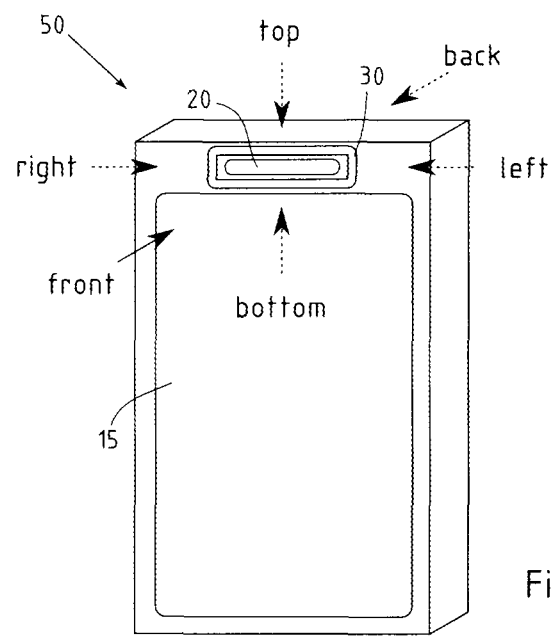
FIG. 3 illustrates a front view of a wireless phone including a sensor according to the invention.

FIG. 3 illustrates a front view of a wireless phone 50 including a sensor according to the invention. In this example, the internal electrode 20 is provided on top of the front face of a mobile communication device, close to the loudspeaker. The grounded shield 22 is provided around the internal electrode, above the display 15 (here a LCD display). The external electrode might have an annular shape around the shield, for example above the display.

The disposition of electrodes of FIGS. 1 and 2 can be generalized to proximity sensor that enable various degrees of 2D or 3D discrimination. The detector of the invention may include a plurality of capacitive electrodes for detecting the proximity of a body portion in a first region while rejecting proximate body portions in a second region. An electronic processing circuit is arranged for reading the capacity seen by each of the electrodes and decide whether a body portion is present in said first region, but not in said second one.

Figure 4:
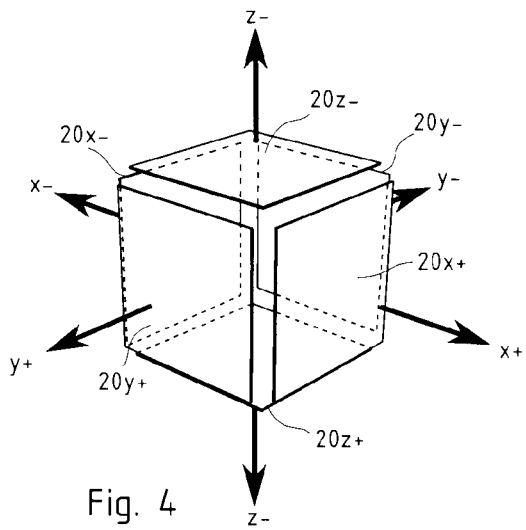
FIG. 4 illustrates schematically a multi-electrode arrangement that provides 3D proximity discrimination.

In most cases, a pair of electrodes will be used for each measure axis, and therefore a 3D sensor could comprise six independent electrodes. FIG. 4 illustrates a symmetrical realization of such a device that includes six electrodes disposed according to the faces of a cube, but other dispositions are possible.

An estimate of the position of an approaching conductor body can be obtained from the capacities read by the electrodes. The electrode 20$x$+, for example, will respond more readily to the presence of conductor in the direction indicated as x+ while the opposite electrode 20$x$− will do the same for conductors in the direction indicated as x−. From these two signals, or from the average value and difference thereof, a position along the x-axis can be estimated. Likewise, the pair 20$y$+/20$y$− that is aligned to the y-axis, can provide an estimate of the y-position, and the pair 20$z$+/20$z$− an estimate of the z− position. In most or all cases, at least two electrodes define one alignment axis and will suffice to determine directional proximity in one direction; the same determination in two dimensions will require at least two independent alignments, which can be obtained by three or preferably four electrodes; a full 3D application needs three independent alignment axis.

Figure 5A:
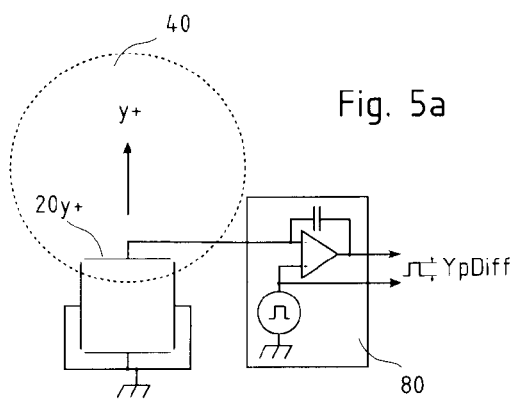
FIGS. 5a and 5b show a manner of reading the electrodes of FIG. 4 and the resulting sense lobes.
Figure 5B:
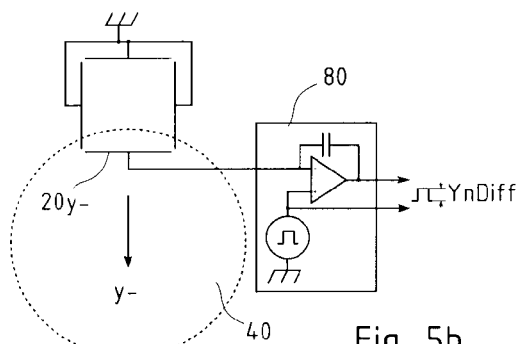

FIGS. 5$a$ and 5$b$ illustrate, in simplified and schematic fashion, a possible readout system for a multi-electrode arrangement: the capacitance seen by each electrode is measured in turn by a suitable readout circuit 80 while the other electrodes are held to ground or to a defined potential. This arrangement enhances the directivity of the measure: In FIG. 5$a$ the electrode 20$x$+ is read, and the detection region 40 is essentially facing that electrode. In FIG. 5$b$, conversely, it is the capacity seen by electrode 20$y$− that is read, and the detection region is correspondingly displaced.

Figure 6:
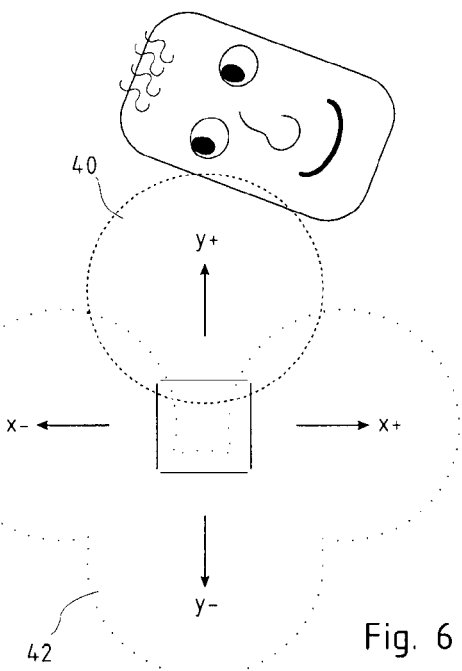
FIG. 6 illustrates how the 3D proximity discrimination can be used to detect when a mobile user is taken to the ear of a user.

By reading all the electrodes, the position of an approaching body can be ascertained, or the apparatus can be programmed to detect objects in a predetermined detection region 40, rejecting those in predetermined rejection regions 42, as illustrated in FIG. 6. In this case the apparatus is included in a mobile phone and is arranged for detecting when the phone is brought to the ear.

The readout circuit 80 represented in the drawings uses a floating AC voltage reference to read the capacitance between the connected electrode and ground whose principles of operation are described in the publication EP2876407 cited above. It must be understood however that this is not an essential feature of the invention, which could make use of any suitable capacity measuring circuit.

Several algorithms for determining directive proximity weighting the capacity signals obtained by the electrodes are possible. According to one example, which has been successfully tested, the determination proceeds as follows:

Initially the values of capacity seen by each sensor are read. Such values are often differential values and are termed XpDiff, XnDiff, YpDiff, YnDiff, ZpDiff, and ZnDiff, where the first letter designates the axis X, Y, or Z and the second the polarity, +/−. A suitable calibration transformation is used to obtain the weighted values XpPond, XnPond, YpPond, YnPond, ZpPond, and ZnPond, from the raw values.

$$Xp\text{Pond}=\text{Coef}Xp\text{Pond}\cdot Xp\text{diff}$$

$$Xn\text{Pond}=\text{Coef}Xn\text{Pond}\cdot Xn\text{diff}$$

$$Yp\text{Pond}=\text{Coef}Yp\text{Pond}\cdot Yp\text{diff}$$

$$Yu\text{Pond}=\text{Coef}Yn\text{Pond}\cdot Yn\text{diff}$$

$$Zp\text{Pond}=\text{Coef}Zp\text{Pond}\cdot Zp\text{diff}$$

$$Zn\text{Pond}=\text{Coef}Zn\text{Pond}\cdot Zn\text{diff}$$

where the transformation is, for this example, a linear homogeneous one. It must be understood, however that the calibration could be more complex and include offset terms as well as non-linear ones. The transformation allows, among other things, aligning the sensor response to the physical X/Y/Z axis.

Average position estimates Xmid, for the x-axis are obtained by:

$$Xmid = \begin{cases} \frac{XpPond}{XnPond} - 1 & \text{if } XpPond \geq XnPond \\ \frac{XpPond}{XnPond} + 1 & \text{if } XpPond < XnPond \end{cases}$$

and analogously for Ymid and Ymid.

A value Xmid=0 indicates that the object is essentially centered on the x-axis, whereas if Xmid<0, the object is mostly on the negative side of the axis, and inversely for the opposite sign.

A directional proximity indicator based on the values of Xmid, Ymid, Zmid can be obtained in several ways. One valid possibility is computing the directional attenuation values Xatten, Yatten, Zatten follows:

$$Xatten = \begin{cases} CoefXmidLow \cdot (Xmid - XmidLow)^2 & \text{if } Xmid \leq XmidLow \\ 0 & \text{if } XmidLow < Xmid \leq XmidHigh \\ CoefXmidHigh \cdot (Xmid - XmidHigh)^2 & \text{if } Xmid > XmidHigh \end{cases}$$

and analogously for Yatten and Zatten.

Finally the quantity YpDir is computed $$YpDir = \frac{YpPond}{1 + Xatten + Yatten + Zatten}$$

and compared to a threshold to determine directive proximity.

Figure 7:
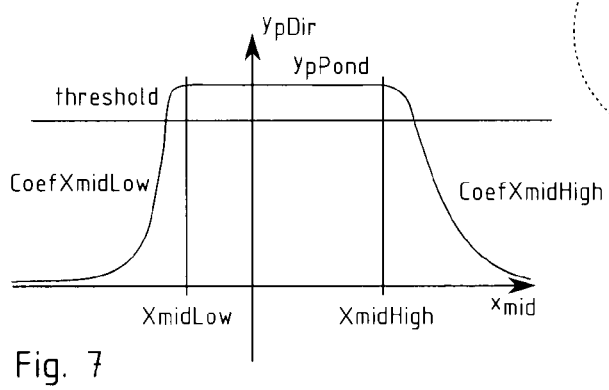
FIGS. 7 and 8 illustrate how the sensitivity lobes can be chosen.
Figure 8:
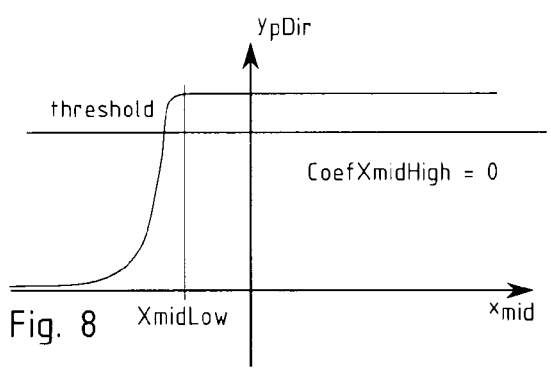

FIGS. 7 and 8 plot the values of YpDir dependent from Xmid. The dependence from Ymid and Zmid would be similar, and has not been plotted to avoid encumbering the figures. XmidLow, respectively XmidHigh, denote the lower and upper thresholds of the directional proximity indicator YpDir, while the coefficient CoefXminLow and CoefXminHigh determine the steepness of the transition. FIG. 8 shows the special case in which CoefXmidHigh=0. In this case, the upper threshold is ineffective.

Figure 9A:
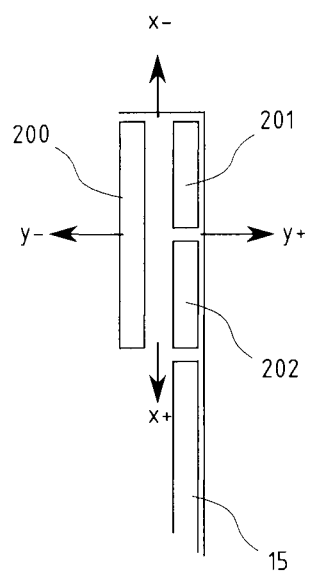
FIGS. 9a and 9b show schematically two possible manners of arranging the device of the invention in a mobile phone, viewed from the side and in section.
Figure 9B:
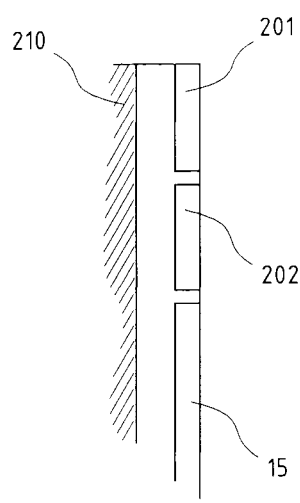

FIGS. 9a and 9b illustrate a possible disposition of the proximity electrodes in a mobile phone. The application that is envisaged is that of dimming or switching off automatically the display when the telephone is close to the user head, for example during a phone call. In this example, a 2D discrimination is considered sufficient. Hence, the detector comprises a pair 201 202 of x-aligned electrodes and one single back electrode 200 behind the x− electrodes. The capacity of the combination 201/202 is used to detect proximity in the y+ direction, that is the direction of approach when the device is moved to the user's head, while the electrode 200 that blocks the detection in the y− direction, thus avoiding false positives from the user's hand holding the phone. The discrimination in the x direction is important to avoid false detection when the fingers of the user approach the upper edge of the phone or the top of the display 15.

The back electrode 200 could provide a signal of directional proximity to objects approaching the device from the back. When this is not needed, it can be replaced with a static ground plane or shield 210, as shown in FIG. 9b.

Figure 10:
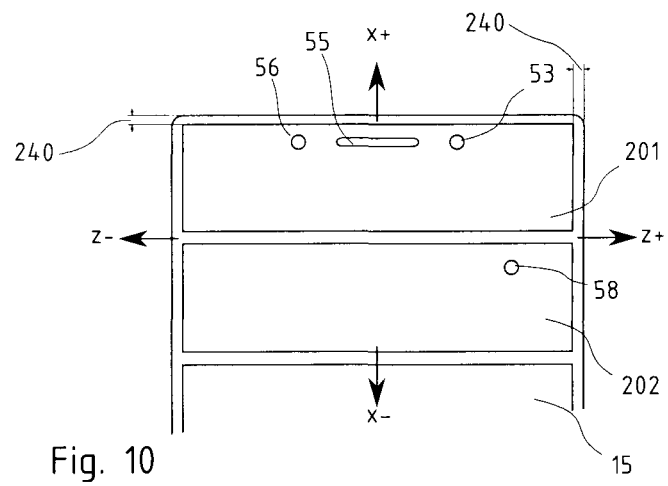
FIGS. 10-13 are possible dispositions of the proximity electrodes in a mobile phone, viewed from the face.

The electrodes 201, 202, and eventually 200 can be advantageously fabricated with flexible PCB techniques, but any kind of conductive electrode would be suitable. The size of the electrodes has a direct impact on the sensitivity and range of the sensor and, in most cases, they will cover all the available surface. A free margin 240 of some millimeter towards the edges, visible in FIG. 10, helps avoiding false detections when the device is gripped by the upper edge or the sides. The electrode can present discontinuities or holes, within reason, to allow the functioning of elements like the loudspeaker 55, an ambient light sensor 56, a camera objective 53, and a LED indicator 58.

Optionally, and insofar as the sense area is not excessively reduced, the PCB carrying the electrodes 201, 202 can also include traces relative to other signals and functions of the phone, although fast switching signal susceptible to interfere with the detection might dictate separation of layers and shielding with ground planes.

Figure 11:
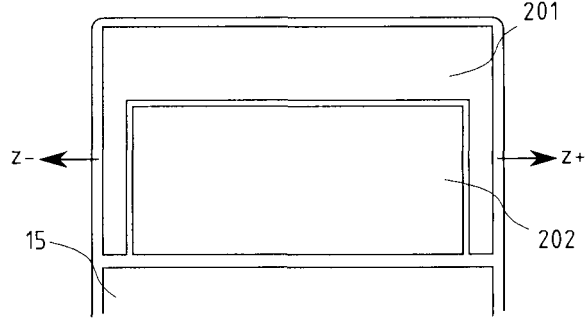

FIG. 11 illustrates a variant in which the x+ electrode 202 is larger than the x− electrode 201, and the latter is u-shaped with thin arms that run along the telephone sides. This arrangement offers several advantages: firstly the increased area of the electrode 202 helps rejecting signal due to a finger moving towards the top of the display 15. Moreover, the side arms of 201 electrode shield the electrode 202 from conductors in the z direction and help rejecting signals due, for example to fingers gripping the phone's sides.

Figure 12:
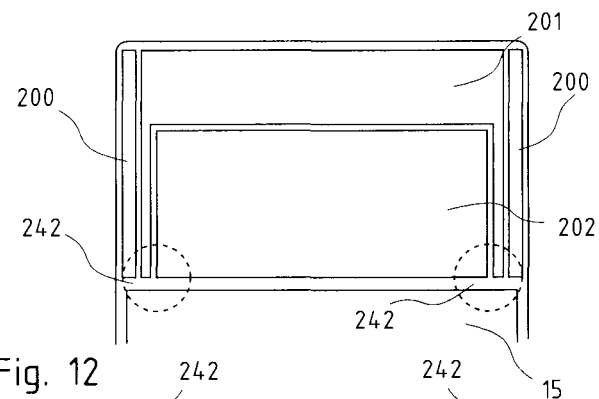

FIG. 12 illustrates another structure in which the z-rejection is further improved by bringing two strips of the electrode 200 in front, for example through vias.

Figure 13:
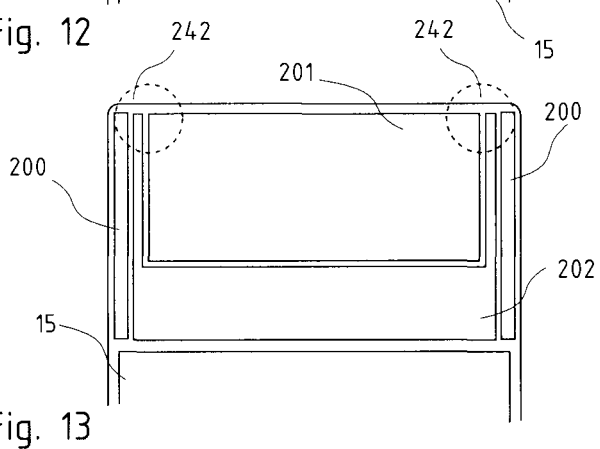

The structure of FIG. 12 presents two regions 242 that could give rise to false detections. FIG. 13 illustrates another implementation in which the "U" shape is applied to the electrode 202, to move the regions 242 upwards, far from the display. These are however only some examples of the possible electrode's shape and, indeed, the invention can make use of electrodes of whichever shape needed to address specific applications.

Figure 14:
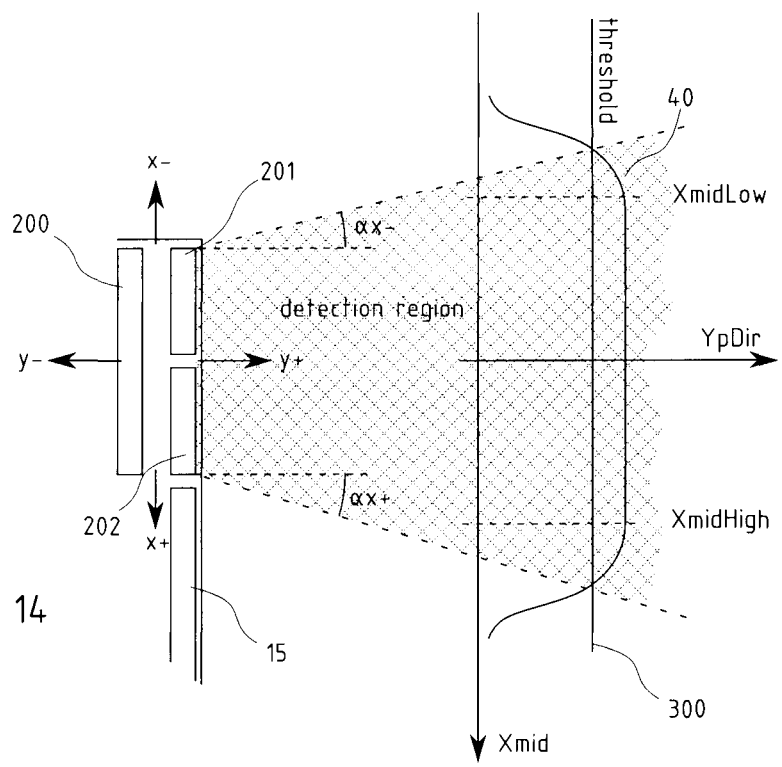
FIGS. 14 and 15 show schematically how the choice of the detection limit angles influences the sense zones.

FIG. 14 shows how the detection region 40 of the device can be adapted to specific applications by choosing the values of parameters XmidLow, XmidHigh, and also CoefXmidLow, CoefXmidHigh (see FIG. 7) and the detection thresholds. Decreasing XmidLow opens the αx− angle, while increasing XmidHigh opens the αx+ angle.

Figure 15:
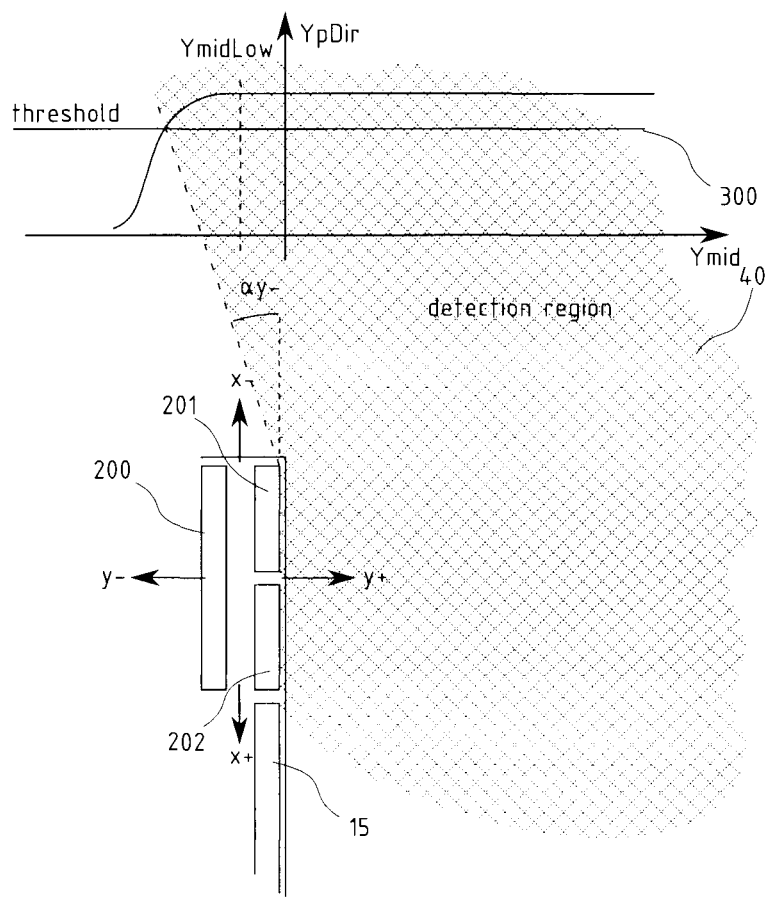

In another possible application represented in FIG. 15, the detection region 40 is delimited by an angle αy− above the telephone. This disposition may be advantageous to detect when a user approaches the phone to the ear in an oblique fashion. It is implemented by setting a discrimination threshold to the signal YpDir. The angle αy− is determined by choosing the values YmidLow, CoefYmidLow opportunely. On the other hand the value CoefYmidHigh is set to zero, thus opening completely the detection region in the direction of increasing y.

The electronic processing unit of the invention is arranged to generate a directional proximity signal based on the capacities seen by the electrodes, when the proximate body part is in a predefined geometric relation, for example in the directions comprised between angles αx− and αx+. The geometric relation required to trigger a proximity signal can be chosen dynamically by setting opportunely the parameters of the detection algorithm, XmidLow, XmidHigh for example.

The variant of FIG. 15 shows how the system of the invention can be arranged in order to detect directional proximity of a body part, including in regions towards the back side (or the lateral sides should the need arise).

The main detection threshold value 300 is set in consideration of the desired detection distance (the higher the threshold, the smaller the detection distance) and of the noise and disturbance levels. Preferably, an hysteresis is introduced to avoid erratic signals. Various debouncing algorithms can also be used, as it is known in the art.

REFERENCE NUMBERS 15 display
20 internal electrode
20x+, 20x− x-axis electrode pair
20y+, 20y− y-axis electrode pair
20z+, 20z− z-axis electrode pair
30 shield
31 bottom or annular plate
40 detection region
42 rejection region
50 cell phone
53 camera
55 loudspeaker
56 ambient light sensor
58 notifications LED
80 readout circuit
200 back electrode
201 front electrode
202 front electrode
210 ground plane
240 margin
242 false detection regions
310 main threshold

The invention claimed is:

1. A proximity sensor for detecting proximity of a body portion in a first region while avoiding unwanted detection of a body portion in a second region, comprising:
a plurality of capacitive electrodes for detecting said body portion in respective detection regions;
an electronic circuit receiving signals from said capacitive electrodes, arranged for producing a directional proximity detection signal when said body portion is in said first region and not in said second region, based on the capacities seen by said capacitive electrodes,
wherein said plurality at capacitive electrodes include;
an internal capacitive electrode for detecting said body portion in the first region;
an external capacitive electrode for detecting said body portion in the second region;
a conductive shield for limiting the sensibility of the internal electrode to body portions in the second region and for limiting the sensibility of the external electrode to body portions in the first region,
and the electronic circuit is arranged for producing a detection signal when a body portion is in the first region but not when a body portion is in the second region.

2. The apparatus of claim 1, the shield comprising at least one lateral wall portion around the internal electrode.

3. The apparatus of claim 2, the shield comprising at least one bottom wall portion under the internal capacitive electrode.

4. The apparatus of claim 2 wherein the lateral wall is perpendicular to each of the internal capacitive electrode and the external capacitive electrode, and is interposed between the internal capacitive electrode and the external capacitive electrode.

5. The apparatus of claim 1, the external capacitive electrode having an annular shape.

6. The apparatus of claim 1, said electronic circuit being arranged for weighting said signals.

7. The apparatus of claim 1 wherein the internal capacitive electrode and the external capacitive electrode are arranged such that they extend along the same plane.

8. The apparatus of claim 1 wherein the electronic circuit is configured to receive signals from the internal electrode and signals from the external electrode, and to make a weighted comparison to determine whether a detected charge comes mainly from the first region, mainly from the second region, or from both regions.

9. A cell phone comprising:
a sensor according to claim 1;
a display;
means to reduce the power consumption of said phone,
whereby the electronic circuit, is arranged to reduce the power consumption when the sensor detects a body in predefined relation of directional proximity.

10. The cell phone of claim 9, comprising a front face with a display and a loudspeaker,
the internal capacitive electrode being arranged on said front face to detect said body portion in said first region close to said loudspeaker.

11. The cell phone of claim 9, the surface of the internal capacitive electrode being smaller than the surface of said display.

12. The cell phone of claim 9, said capacitive electrodes being arranged above said display.

13. The cell phone of claim 9, comprising lateral sides and a back side,
said capacitive electrodes being arranged for detecting body portions in a plurality of regions including regions toward said lateral sides and toward said back side.

* * * * *